(12) United States Patent  
Derkacs et al.

(10) Patent No.: US 10,403,778 B2  
(45) Date of Patent: Sep. 3, 2019

(54) MULTIJUNCTION SOLAR CELL ASSEMBLY FOR SPACE APPLICATIONS

(71) Applicant: SolAero Technologies Corp., Albuquerque, NM (US)

(72) Inventors: Daniel Derkacs, Albuquerque, NM (US); Jeff Steinfeldt, Rio Rancho, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 142 days.

(21) Appl. No.: 15/250,673

(22) Filed: Aug. 29, 2016

(65) Prior Publication Data

US 2017/0110615 A1    Apr. 20, 2017

Related U.S. Application Data

(60) Provisional application No. 62/243,239, filed on Oct. 19, 2015, provisional application No. 62/288,181, filed on Jan. 28, 2016.

(51) Int. Cl.
| | |
|---|---|
| *H01L 31/0725* | (2012.01) |
| *H01L 31/0304* | (2006.01) |
| *H01L 31/05* | (2014.01) |
| *H01L 31/18* | (2006.01) |
| *H01L 31/0687* | (2012.01) |

(52) U.S. Cl.  
CPC .... *H01L 31/0725* (2013.01); *H01L 31/03046* (2013.01); *H01L 31/0504* (2013.01); *H01L 31/0687* (2013.01); *H01L 31/1844* (2013.01); *Y02E 10/544* (2013.01); *Y02P 70/521* (2015.11)

(58) Field of Classification Search  
CPC ........... H01L 31/03046; H01L 31/0693; H01L 31/06875; H01L 31/06; H01L 31/184; H01L 31/1844; H01L 31/03529; H01L 31/0735  
See application file for complete search history.

(56) References Cited

U.S. PATENT DOCUMENTS

| | | |
|---|---|---|
| 4,001,864 A | 1/1977 | Gibbons |
| 4,255,211 A | 3/1981 | Fraas |
| 4,338,480 A | 7/1982 | Antypas et al. |
| 4,612,408 A | 9/1986 | Moddel et al. |

(Continued)

FOREIGN PATENT DOCUMENTS

| | | |
|---|---|---|
| CN | 103426965 A | 12/2013 |
| DE | 20 2012 104 415 U1 | 2/2013 |

(Continued)

OTHER PUBLICATIONS

L. M. Fraas et al, "34% Efficient InGaP/GaAs/GaSb Cell-Interconnected-Circuits for Line-Focus Concentrator Arrays", Proceedings of the 16th European Photovoltaic Solar Energy Conference (James & James Ltd.) (2000) 929.

(Continued)

*Primary Examiner* — Golam Mowla

(57) ABSTRACT

A multijunction solar cell assembly and its method of manufacture including first and second discrete and different semiconductor body subassemblies which are electrically interconnected to form a five junction solar cell, each semiconductor body subassembly including first, second, third and fourth lattice matched subcells; wherein the average band gap of all four cells in each subassembly is greater than 1.44 eV.

17 Claims, 6 Drawing Sheets

(56) References Cited

U.S. PATENT DOCUMENTS

| | | |
|---|---|---|
| 5,019,177 A | 5/1991 | Wanlass |
| 5,053,083 A | 10/1991 | Sinton |
| 5,217,539 A | 6/1993 | Fraas et al. |
| 5,322,572 A | 6/1994 | Wanlass |
| 5,342,453 A | 8/1994 | Olson |
| 5,376,185 A | 12/1994 | Wanlass |
| 5,479,032 A | 12/1995 | Forrest et al. |
| 5,828,088 A | 10/1998 | Mauk |
| 5,944,913 A | 8/1999 | Hou et al. |
| 6,180,432 B1 | 1/2001 | Freeouf |
| 6,239,354 B1 | 5/2001 | Wanlass |
| 6,252,287 B1 | 6/2001 | Kurtz et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,340,788 B1 | 1/2002 | King et al. |
| 6,482,672 B1 | 11/2002 | Hoffman et al. |
| 6,618,410 B1 | 9/2003 | Fischer et al. |
| 6,660,928 B1 | 12/2003 | Patton et al. |
| 6,815,736 B2 | 11/2004 | Mascarenhas |
| 6,951,819 B2 | 10/2005 | Iles et al. |
| 7,071,407 B2 | 7/2006 | Faterni et al. |
| 7,741,146 B2 | 6/2010 | Cornfeld et al. |
| 7,767,480 B1 | 8/2010 | Pickrell et al. |
| 7,785,989 B2 | 8/2010 | Sharps et al. |
| 7,960,201 B2 | 6/2011 | Cornfeld et al. |
| 8,236,600 B2 | 8/2012 | Cornfeld |
| 8,263,853 B2 | 9/2012 | Varghese |
| 8,969,712 B2 | 3/2015 | Newman et al. |
| 9,018,521 B1 | 4/2015 | Cornfeld |
| 9,252,313 B2 | 2/2016 | Meusel et al. |
| 2001/0018924 A1 | 9/2001 | Hisamatsu et al. |
| 2002/0117675 A1 | 8/2002 | Mascarenhas |
| 2003/0089392 A1 | 5/2003 | Rohr et al. |
| 2004/0166681 A1 | 8/2004 | Iles et al. |
| 2004/0200523 A1 | 10/2004 | King et al. |
| 2005/0155641 A1 | 7/2005 | Fafard |
| 2005/0247339 A1 | 11/2005 | Barnham et al. |
| 2005/0274411 A1 | 12/2005 | King et al. |
| 2006/0021565 A1 | 2/2006 | Zahler et al. |
| 2006/0144435 A1 | 7/2006 | Wanlass |
| 2006/0162768 A1 | 7/2006 | Wanlass et al. |
| 2007/0113887 A1 | 5/2007 | Laih et al. |
| 2007/0218649 A1 | 9/2007 | Hernandez |
| 2007/0277873 A1 | 12/2007 | Cornfeld et al. |
| 2008/0029151 A1 | 2/2008 | McGlynn et al. |
| 2008/0149173 A1 | 6/2008 | Sharps |
| 2008/0163920 A1 | 7/2008 | Meusel et al. |
| 2008/0185038 A1 | 8/2008 | Sharps |
| 2008/0245409 A1 | 10/2008 | Varghese et al. |
| 2009/0038679 A1 | 2/2009 | Varghese et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0155952 A1 | 6/2009 | Stan et al. |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2010/0012174 A1 | 1/2010 | Varghese et al. |
| 2010/0012175 A1 | 1/2010 | Vraghese et al. |
| 2010/0147366 A1 | 6/2010 | Stan et al. |
| 2010/0186804 A1 | 7/2010 | Cornfeld |
| 2010/0203730 A1 | 8/2010 | Cornfeld et al. |
| 2010/0206365 A1 | 8/2010 | Chumney et al. |
| 2010/0229913 A1 | 9/2010 | Cornfeld |
| 2011/0011983 A1 | 1/2011 | King et al. |
| 2012/0042937 A1 | 2/2012 | Wagner |
| 2014/0190559 A1 | 7/2014 | Meusel et al. |
| 2014/0261628 A1 | 9/2014 | Meitl et al. |
| 2015/0090321 A1 | 4/2015 | Cho et al. |
| 2016/0181464 A1 | 6/2016 | Cornfeld |

FOREIGN PATENT DOCUMENTS

| | | |
|---|---|---|
| DE | 102011115340 A1 | 4/2013 |
| DE | 10 2012 004 734 A1 | 9/2013 |
| EP | 0848433 A2 | 6/1998 |
| EP | 0 658 944 B1 | 4/2009 |
| FR | 2 878 076 A1 | 5/2006 |
| WO | WO 2004/017425 A1 | 2/2004 |
| WO | WO 2005/015638 A1 | 2/2005 |
| WO | WO 2006/072423 A1 | 7/2006 |
| WO | WO 2013/074530 A2 | 5/2013 |
| WO | WO 2013/132073 A2 | 9/2013 |

OTHER PUBLICATIONS

Search Report and Opinion dated Mar. 17, 2017 for European Patent Application No. 16187299.9, 12 pages.

Search Report and Opinion dated Mar. 21, 2017 for European Patent Application No. 16194190.1, 13 pages.

U.S. Appl. No. 13/872,663, filed Apr. 29, 2013, Stan et al.

U.S. Appl. No. 14/828,206, filed Aug. 17, 2015, Derkacs.

Aiken et al. "Consideration of High Bandgap Subcells for Advanced Multijunction Solar Cells," Conference Record of the 2006 IEEE $4^{th}$ World Conference on Photovoltaic Energy Conversion. May 1, 2006, pp. 838-841.

Andreev et al., "High-efficiency AlGaAs—GaAs solar cells with internal Bragg reflector," Conference Record of the $24^{th}$ IEEE Photovoltaic Specialists Conference, Waikoloa, Hawaii, Dec. 5-9, 1994; vol. 2:1894-1897.

Andreev, Heterostructure solar cells, Semiconductors, Sep. 1999; 33(9):942-945.

Basic Parameters of $Al_xGa_{1-x}As$ at 300 K, [retrieved on May 19, 2016]. Retrieved from the Internet: <URL:http://www.ioffe.ru/SVA/NSM/Semicond/AlGaAs/basic.html>; 1 pg.

Basic Parameters of GaAs at 300 K, [retrieved on May 19, 2016]. Retrieved from the Internet: <URL:http://www.ioffe.ru/SVA/NSM/Semicond/GaAs/basic.html>; 1 pg.

Bett et al., "Advanced III-V solar cell structures grown by MOVPE," *Solar Energy Materials & Solar Cells*, 2001; 66:541-550.

Brown et al., "Results of the Telstar Radiation Experiments," Bell System Technical Journal, 42, 1505-1559, 1963.

Bushnell et al., "Short-circuit current enhancement in Bragg stack multi-quantum-well solar cells for multi-junction space cell applications," Solar Energy Materials and Solar Cells, Jan. 2003; 75(1-2):299-305.

Cornfeld et al., "Development of a Large Area Inverted Metamorphic Multi-junction (IMM) Highly Efficient AM0 Solar Cell," 33rd IEEE Photovoltaic Specialists Conference, May 11-16, 2008, San Diego, CA, USA; 5 pgs.

Cornfeld et al., "Development of a Large Area Inverted Metamorphic Multi-junction Highly Efficient AM0 Solar Cell," Conference paper presented at the $33^{rd}$ IEEE Photovoltaic Specialists Conference (May 11-16, 2008) on May 12, 2008. San Diego, CA, USA; 17 pages.

Cornfeld et al., "Advances in the Performance of Inverted Metamorphic Multi-junction Solar Cells," $23^{rd}$ European Photovoltaic Energy Conference, Sep. 1-5, 2008, Valencia, Spain; 11 pgs.

Dimroth et al., "Metamorphic $Ga_yIn_{1-y}P/Ga_{1-x}In_xAs$ tandem solar cells for space and for terrestrial concentrator applications at C > 1000 suns," Progress in Photovoltaics: Research and Applications, May/Jun. 2001; 9(3):165-178.

Dimroth et al., "Next Generation GaInP/GaInAs/Ge multi-junction space solar cells," Proceedings of the $17^{th}$ European Photovoltaic Specialists Conference, Munich Germany, Oct. 22-26, 2001, pp. 2150-2154.

Dimroth et al., "5-junction III-V solar cells for space applications," Proceedings of $3^{rd}$ World Conference on Photovoltaic Energy Conversion, Osaka, Japan, May 18, 2003; 1:616-621.

Dimroth et al., "3-6 junction photovoltaic cells for space and terrestrial concentrator applications," Conference Record of the $31^{st}$ IEEE Photovoltaic Specialists Conference, Jan. 3-7, 2005; 525-529.

(56) References Cited

OTHER PUBLICATIONS

Durbin, "A computational approach to the analysis of distributed Bragg reflectors in direct-gap solar cells," Conference Record of the 25th IEEE Photovoltaic Specialists Conference, Washington, DC, May 13-17, 1996; 69-72.

Friedman et al., "1-eV solar cells with GaInNAs active layer," Journal of Crystal Growth, Dec. 1998; 195(1-4):409-415.

Friedman et al., "0.7-eV GaInAs Junction for a GaInP/GaAs/GaInAs(1eV)/GaInAs(0.7eV) Four-Junction Solar Cell," 2006 IEEE 4th World Conference on Photovoltaic Energy Conversion, May 7-12, 2006; pp. 598-602. Waikoloa, Hawaii, USA.

Geisz et al., "High-efficiency GaInP/GaAs/InGaAs triple-junction solar cells grown inverted with a metamorphic bottom junction," Applied Physics Letters, 2007; 91(023502):023502-1-023502-3. Online publication Jul. 10, 2007. American Institute of Physics, Melville, NY, USA.

Geisz, et al., "Inverted GaInP/(In)GaAs/InGaAs Triple-Junction Solar Cells with Low-Stress Metamorphic Bottom Junctions," 33rd IEEE Photovoltaic Specialists Conference, May 11-16, 2008, San Diego, CA, USA; 5 pgs.

Hatcher, "Solar Cell Manufacturers Come Back Down to Earth," Compound Semiconductor News, Nov. 25, 2003 [retrieved on May 19, 2016]. Retrieved from the Internet: <URL:http://www.compoundsemiconductor.net/article/83127-solar-cell-manufacturers-come-back-down-to-earth.html>; 2 pgs.

King et al., "Next-Generation, High-Efficiency III-V Multijunction Solar Cells," 28th IEEE Photovoltaic Specialists Conference, Sep. 15-22, 2000, Anchorage, AK, USA.

King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, New Orleans, LA, USA; pp. 776-781.

King et al., "High-voltage, low-current GaInP/GaInP/GaInNAs/Ge solar cells," Conference Record of the 29th IEEE Photovoltaic Specialists Conference, New Orleans, Louisiana, May 19-24, 2002; 852-855.

King et al., "Metamorphic III-V materials, sublattice disorder, and multijunction solar cell approaches with over 37% efficiency," Presented at the 19th European Photovoltaic Solar Energy Conference and Exhibition, Paris, France, Jun. 7-11, 2004 [retrieved on May 19, 2016]. Retrieved from the Internet: <URL:http://www.spectrolab.com/pv/support/R.%20King%20et%20al.,%20EU%20PVSEC%202004,%20Metamorphic%20III-V%20materials.pdf>; 7 pgs.

Lantratov, "Effect of the increase of radiation resistance in solar cells with internal Bragg reflector," in Proceedings of the Twenty-Seventh State-of-the-Art Program on Compound Semiconductors, edited by S. Chu, 1997, pp. 125-132.

Law et al., "Future Technology Pathways of Terrestrial III-V Multijunction Solar Cells for Concentrator Photovoltaic Systems," Solar Energy Materials and Solar Cells, 2010; 94:1314-1318.

Lewis et al., "The Crystallographic Connection of MOCVD-Grown Monolithic Cascade Subcells via Transparent Graded Layers," Journal of Crystal Growth, 1984; 69:515-526.

Lewis et al., "Recent Developments in Multijunction Solar Cell Research," Solar Cells, 1988; 24:171-183.

Luque et al., "Chapter 4. Theoretical Limits of Photovoltaic Conversion," in Handbook of Photovoltaic Science and Engineering. Luque and Hegedus (eds). John Wiley & Sons, Ltd., Chichester, UK. 2003; 113-151.

Marvin, Assessment of Multijunction Solar Cell Performance in Radiation Environments, Aerospace Report No. TOR-2000 (1210)-1, 2000; 90 pages.

Trupke et al., "Improved spectral robustness of triple tandem solar cells by combined series/parallel interconnection," J. Appl. Phys., 2004; 96:2347-2351.

Venkatasubramanian et al., "An Inverted-Growth Approach to Development of an IR-Transparent, High-Efficiency AlGaAs/GaAs Cascade Solar Cell," 22nd IEEE Photovoltaic Specialists Conference, Oct. 7-11, 1991, Las Vegas, NV, USA; pp. 93-98.

Vernon et al., Growth and characterization of $Al_xGa_{1-x}As$ Bragg reflectors by LP-MOCVD, Journal of Electronic Materials, Mar. 1992; 21(3):335-340.

Wanlass et al., "Lattice-Mismatched Approaches for High-Performance, III-V Photovoltaic Energy Converters," Proceedings of the 31st IEEE PVSC, Jan. 3-7, 2005, Lake Buena Vista, FL, USA; pp. 530-535.

Wanlass et al., "Monolithic, Ultra-Thin GaInP/GaAs/GaInAs Tandem Solar Cells," 2006 IEEE 4th World Conference on Photovoltaic Energy Conversion, May 7-12, 2006, Waikoloa, Hawaii, USA; pp. 729-732.

Wurfel, Physics of Solar Cells: from Basic Principles to Advanced Concepts, 2nd Updated and Expanded Edition, 2009. Sections 6.4, 6.5 and 6.8; 20 pages. Wiley-VCH, Weinheim, Germany.

Yamaguchi, "Physics and Technologies of Superhigh-Efficiency Tandem Solar Cells," Semiconductors, Sep. 1999; 33(9):961-964, Toyota Technological Institute, Nagoya, Japan, © 1999, American Institute of Physics.

Yamaguchi, "Multi-junction solar cells and novel structures for solar cell applications," Physica E, 2002; 14:84-90.

Yoon et al., "Progress of Inverted Metamorphic III-V Solar Cell Development at Spectrolab," 33rd IEEE Photovoltaic Specialists Conference, May 11-16, 2008, San Diego, CA, USA; 6 pgs.

Meusel et al., "Spectral response measurements of monolithic GaInP/Ga(In)As/Ge triple-junction solar cells: Measurement artifacts and their explanation," Progress in Photovoltaics: Research and Applications, Dec. 2003; 11(8):499-514.

Meusel et al., "European roadmap for the development of III-V multi-junction space solar cells," 19th European Photovoltaic Solar Energy Conference, Paris, France. Jun. 7-11, 2004; 3581-3586.

"Partial European Search Report," Application No. EP 08 01 3466, dated Feb. 12, 2009. European Patent Office, Berlin, Germany.

Patel et al., "Experimental Results From Performance Improvement and Radiation Hardening of Inverted Metamorphic Multijunction Solar Cells," IEEE Journal of Photovoltaics, Jul. 2012; 2(3):377-381.

Schultz et al. "High Efficiency 1.0 eV GaInAs Bottom Solar Cell for 3-Junction Monolithic Stack," IEEE, 1990; 148-152.

Sexl et al., "MBE Growth of Metamorphic In(Ga)AlAs Buffers," 1997 IEEE International Symposium on Compound Semiconductors, Sep. 1997; IEEE, Piscataway, NJ; pp. 49-52.

Sharps et al., "Inverting the triple junction improves efficiency and flexibility," Compound Semiconductor, Oct. 2007, 13(9):25-28. IOP Publishing, Ltd., Bristol, England.

Shvarts et al., "Radiation resistant AlGaAs/GaAs concentrator solar cells with internal Bragg reflector," Solar Energy Materials and Solar Cells, Mar. 2001; 68(1):105-122.

Sinharoy et al., "Progress in the Development of Metamorphic Multi-junction III-V Space Solar Cells," Progress in Photovoltaics: Research and Applications, Feb. 2002; 10:427-432. John Wiley & Sons, Ltd, Hoboken, NJ, USA.

Stan et al., "Very High Efficiency Triple Junction Solar Cells by MOVPE," 14th International Conference of Metalorganic Vapor Phase Epitaxy. Jun. 1-6, 2008, Metz, France; 32 pgs.

Tada et al., Solar Cell Radiation Handbook, Third Edition, JPL Publication 82-69, 1982; cover page, face page and Table of Contents; 7 pgs.

Takamoto et al., "InGaP/GaAs-based Multijunction Solar Cells," Progress in Photovoltaics: Research and Applications, 2005; 13:495-511.

Tobin et al., "Enhanced light absorption in GaAs solar cells with internal Bragg reflectors," Conference Record of the 22nd IEEE Photovoltaic Specialists Conference, Las Vegas, NV, Oct. 7-11, 1991; vol. 1:147-152.

MULTIJUNCTION SOLAR CELL ASSEMBLY FOR SPACE APPLICATIONS

REFERENCE TO RELATED APPLICATIONS

The present application claims the benefit of U.S. Provisional Patent Application Ser. Nos. 62/243,239 filed Oct. 19, 2015 and 62/288,181 filed Jan. 28, 2016.

The present application is related to U.S. patent application Ser. No. 15/203,975 filed Jul. 7, 2016, and U.S. patent application Ser. No. 15/250,643 filed simultaneously hereto.

This application is also related to co-pending U.S. patent application Ser. No. 15/210,532 filed Jul. 14, 2016, and Ser. No. 15/213,594 filed Jul. 19, 2016.

This application is also related to co-pending U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to co-pending U.S. patent application Ser. No. 13/872,663 filed Apr. 29, 2012, which was also a continuation-in-part of application Ser. No. 12/337,043, filed Dec. 17, 2008

This application is also related to co-pending U.S. patent application Ser. Nos. 14/828,197 and 14/828,206 filed Aug. 17, 2015.

All of the above related applications are incorporated herein by reference in their entirety.

BACKGROUND OF THE INVENTION

Field of the Invention

The present disclosure relates to solar cells and the fabrication of solar cells, and more particularly the design and specification of a multijunction solar cell using electrically coupled but spatially separated semiconductor bodies based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum. As such, the characteristic of sunlight absorption in semiconductor material, also known as photovoltaic properties, is critical to determine the most efficient semiconductor to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current.

The electrical characteristics of a solar cell, such as the short circuit current density ($J_{sc}$), the open circuit voltage ($V_{oc}$), and the fill factor, are affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. The overall power output and conversion efficiency of the solar cell are thereby affected in different and often unpredictable ways. Such factors also vary over time (i.e. during the operational life of the system).

Accordingly, it is evident that the consideration of any one design parameter or variable, such as the amount of a particular constituent element in a layer, or the band gap of that layer, affects each of the electrical characteristics in a different way, sometimes in opposite directions, and such changes does not predictably lead to an increase in power out or solar cell efficiency. Stated another way, focus on any one such parameter in the design of a multijunction solar cell is not a viable calculus since each variable standing alone is NOT a simple "result effective" variable that can be automatically adjusted by those skilled in the art confronted with complex design specifications and practical operational considerations in order to achieve greater power output or a related design objective.

Another parameter of consideration taught by the present disclosure is the difference between the band gap and the open circuit voltage, or ($E_g/q - V_{oc}$), of a particular active layer, and such parameter may vary depending on subcell layer thicknesses, doping, the composition of adjacent layers (such as tunnel diodes), and even the specific wafer being examined from a set of wafers processed on a single supporting platter in a reactor run.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters. The present application is directed to solar cells with several substantially lattice matched subcells, and in a particular embodiment to a five junction (5J) solar cell using electrically coupled but spatially separated four junction (4J) semiconductor bodies based on III-V semiconductor compounds.

SUMMARY OF THE DISCLOSURE

Objects of the Disclosure

It is an object of the present disclosure to provide increased photoconversion efficiency in a multijunction solar cell for space applications over the operational life of the photovoltaic power system.

It is another object of the present disclosure to provide in a multijunction solar cell in which the selection of the composition of the subcells and their band gaps maximizes the efficiency of the solar cell at a predetermined high temperature (in the range of 40 to 70 degrees Centigrade) in deployment in space at AM0 at a predetermined time after the initial deployment, such time being at least one, five, ten, fifteen, or twenty years.

It is another object of the present invention to provide a four junction solar cell in which the average band gap of all four cells is greater than 1.44 eV.

It is another object of the present invention to provide two different lattice matched four junction solar cell subassemblies or bodies in which the current through the bottom subcell of each subassembly is intentionally designed to be substantially greater than current through the top three subcells when measured at the "beginning-of-life" or time of initial deployment.

It is another object of the present invention to provide a five-junction (5J) solar assembly assembled from two different four-junction (4J) solar cell subassemblies.

Some implementations of the present disclosure may incorporate or implement fewer of the aspects and features noted in the foregoing objects.

Features of the Invention

Briefly, and in general terms, the present disclosure describes solar cells that include a solar cell assembly of two or more solar cell subassemblies, each of which includes a respective monolithic semiconductor body composed of a tandem stack of solar subcells, where the subassemblies are interconnected electrically to one another.

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.2, or 1.3 to 1.4, or 1.5 to 1.9 eV.

As described in greater detail, the inventors of the present application have discovered that interconnecting two or more spatially split multijunction solar cell subassemblies can be advantageous. The spatial split can be provided for multiple solar cell subassemblies assembled on a single support or, and substrate coupled together electrically.

One advantage of interconnecting two or more spatially split multi-junction solar cell subassemblies is that such an arrangement can allow accumulation of the current of different subcell arrangements fabricated in different semiconductor bodies.

Further, selection of relatively high band gap semiconductor materials for the top subcells can provide for increased photoconversion efficiency in a multijunction solar cell for outer space or other applications over the operational life of the photovoltaic power system. For example, increased photoconversion efficiency at a predetermined time after initial deployment of the solar cell can be achieved.

The subcells are configured so that the current density of the upper first subcell and the second subcell have a substantially equal predetermined first value, and the current density of the bottom subcell is at least twice that of the predetermined first value.

Briefly, and in general terms, the present disclosure provides a five junction solar cell assembly comprising including a terminal of first polarity and a terminal of second polarity comprising: a first semiconductor body including a tandem vertical stack of at least a first upper, a second and a bottom solar subcells; and a second semiconductor body disposed adjacent and parallel to the first semiconductor body and including a tandem vertical stack of at least a first upper, a second and a bottom solar subcells substantially identical to that of the first semiconductor body, the first upper subcell of the first and second semiconductor bodies having a top contact connected to the terminal of first polarity, the third bottom subcell of the second semiconductor body having a bottom contact connected to the terminal of second polarity; wherein the third subcell of the first semiconductor body is connected in a series electrical circuit with the third subcell of the second semiconductor body so that the interconnection of subcells of the first and second semiconductor bodies forms at least a four junction solar cell; and wherein the sequence of layers in the first and the second semiconductor bodies are different.

In some embodiments, the upper first subcell of the first and second semiconductor bodies is composed of indium gallium phosphide (InGaP); the second solar subcell of the first and second semiconductor bodies disposed adjacent to and lattice matched to said upper first subcell, the second solar subcell composed of aluminum gallium arsenide (AlGaAs) or indium gallium arsenide phosphide (InGaAsP), and the third subcell is the bottom subcell of each of the semiconductor bodies and is lattice matched to said second subcell and is composed of germanium (Ge).

In some embodiments, the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum gallium arsenide (AlGaAs); the third subcell is disposed adjacent to and lattice matched to said second subcell and is composed of gallium arsenide (GaAs), and the bottom subcell of the first and second semiconductor body is lattice matched to said second subcell and is composed of germanium (Ge).

In some embodiments, the first semiconductor body further comprises a first highly doped lateral conduction layer disposed adjacent to and beneath the second solar subcell.

In some embodiments, the second semiconductor body further comprises a second highly doped lateral conduction layer disposed adjacent to and beneath the second solar subcell, and a blocking p-n diode or insulating layer disposed adjacent to and beneath the second highly doped lateral conduction layer, and a third highly doped lateral conduction layer disposed adjacent to and beneath the blocking p-n diode or insulating layer.

In some embodiments, the short circuit density ($J_{sc}$) of each of the bottom subcells is at least twice that of the first and second subcells.

In some embodiments, the short circuit current density ($J_{sc}$) of the first and second subcells are each approximately 17 mA/cm$^2$, and the short circuit current density ($J_{sc}$) of each of the bottom subcells is approximately 34 mA/cm$^2$.

In some embodiments, the short circuit current density ($J_{sc}$) of the first, second and third middle subcells are each approximately 11 mA/cm$^2$.

In some embodiments, the short circuit current density ($J_{sc}$) of each of the bottom subcells is approximately 22.6 mA/cm$^2$.

In some embodiments, at least the base of at least one of the first, second or third solar subcells has a graded doping.

In some embodiments, there further comprises a third middle solar subcell composed of gallium arsenide (GaAs) disposed adjacent to and beneath the second solar subcell, and above the bottom solar subcell.

In some embodiments, there further comprises a first conductive interconnect extending between the contact layer of the first upper subcell of the first semiconductor body to the contact layer of the first upper subcell of the second semiconductor body.

In some embodiments, there further comprises a second conductive interconnect extending between the bottom contact layer of the third subcell of the first semiconductor body to the bottom contact layer of the third subcell of the second semiconductor body.

In some embodiments, there further comprises a third conductive interconnect extending between the bottom contact layer of the bottom subcell of the first semiconductor body to the top contact layer of the bottom subcell of the second semiconductor body.

In some embodiments, there further comprises a third semiconductor body disposed adjacent to the second semiconductor body and including a tandem vertical stack of at least a first upper, a second, third and a fourth bottom solar subcells, the first upper subcell having a top contact connected to the terminal of first polarity, the fourth bottom subcell having a bottom contact connected to the terminal of a second polarity; wherein the top contact of the first upper subcells of the first, second and third semiconductor bodies are connected, and the fourth subcell of the first semiconductor body is connected in a series electrical circuit with the fourth subcell of the second semiconductor body, which in turn is connected in a series electrical circuit with the fourth subcell of the third semiconductor body.

In some embodiments, the respective selection of the composition, band gaps, open circuit voltage, and short circuit current of each of the subcells maximizes the efficiency of the assembly (i) at high temperature (in the range of 40 to 100 degrees Centigrade) in deployment in space at a predetermined time after the initial deployment (referred to as the beginning of life or BOL), such predetermined time being referred to as the end-of-life (EOL), wherein such predetermined time is in the range of one to twenty-five years; or (ii) at low temperature (in the range of −150 to −100 degrees Centigrade), and low solar radiation intensity less than 0.1 suns, in deployment in space at a predetermined time after the initial deployment (referred to as the beginning of life or BOL), such predetermined time being referred to as the end-of-life (EOL), wherein such predetermined time is in the range of one to twenty-five years.

In some embodiments, one or more of the subcells have a base region having a gradation in doping that increases exponentially from a value in the range of $1 \times 10^{15}$ to $1 \times 10^{18}$ free carriers per cubic centimeter adjacent the p-n junction to a value in the range of $1 \times 10^{16}$ to $4 \times 10^{18}$ free carriers per cubic centimeter adjacent to the adjoining layer at the rear of the base, and an emitter region having a gradation in doping that decreases from a value in the range of approximately $5 \times 10^{18}$ to $1 \times 10^{17}$ free carriers per cubic centimeter in the region immediately adjacent the adjoining layer to a value in the range of $5 \times 10^{15}$ to $1 \times 10^{18}$ free carriers per cubic centimeter in the region adjacent to the p-n junction.

In another aspect, the present disclosure provides a method of forming a solar cell assembly including a terminal of first polarity and a terminal of second polarity comprising: forming first and second semiconductor bodies, each including an identical tandem vertical stack of at least an upper first, a second and a third solar subcells, and a bottom solar subcell; mounting the second semiconductor body adjacent to the first semiconductor body; providing a bottom contact on the bottom subcell of the second semiconductor body; connecting the bottom contact on the bottom subcell of the second semiconductor body to the terminal of second polarity; connecting the third subcell of the first semiconductor body in a series electrical circuit with the third subcell of the second semiconductor body so that at least a four junction solar cell is formed by the assembly; and providing a top electric contact on the upper first subcell of the first and second semiconductor bodies and electrically connecting each of the top electrical contacts to the terminal of first polarity.

In some embodiments, the average band gap of all four subcells (i.e., the sum of the four band gaps of each subcell divided by 4) in each semiconductor body is greater than 1.44 eV, and the fourth subcell is comprised of a direct or indirect band gap material such that the lowest direct band gap of the material is greater than 0.75 eV.

In some implementations, the average band gap of all of the subcells is greater than 1.44 eV. In some instances, the band gap of the first upper subcell is in the range of 2.0 to 2.20 eV, the band gap of the second subcell is in the range of 1.65 to 1.8 eV, the third subcell has a band gap of approximately 1.41 eV, and the band gap of the bottom subcell is in the range of 0.6 to 0.8 eV. Other implementations may have different band gap ranges.

In some implementations, the first semiconductor body further includes one or more of the following features. For example, there may be a first highly doped lateral conduction layer disposed adjacent to the fourth solar subcell. The first semiconductor body also can include a blocking p-n diode or insulating layer disposed adjacent to and above the highly doped lateral conduction layer. The first semiconductor body may further include a second highly doped lateral conduction layer disposed adjacent to and above the blocking p-n diode or insulating layer. A metamorphic layer can be disposed adjacent to and above the second highly doped lateral conduction layer.

Some implementations can include additional solar subcells in one or more of the semiconductor bodies.

The solar cell subassembly can further include a plurality of openings in the first semiconductor body, each of the openings extending from a top surface of the first semiconductor body to a different respective contact layer in the first semiconductor body. Thus, for example, a first opening in the first semiconductor body can extend from the top surface of the semiconductor body to the first lateral conduction layer. A metallic contact pad can be disposed on the lateral conduction layer. A second opening in the first semiconductor body can extend from the top surface of the semiconductor body to the contact back metal later of the bottom subcell.

In some implementations, the short circuit density ($J_{sc}$/cm$^2$) of the (Al)InGaP first upper subcell is approximately 12 mA/cm$^2$. The short circuit density ($J_{sc}$/cm$^2$) of the first upper subcell may have another value for different implementations.

In another aspect, a solar cell assembly includes a terminal of first polarity and a terminal of second polarity. The solar cell assembly includes a first semiconductor body including a tandem vertical stack of at least a first upper, a second, a third and a fourth solar subcell, the first upper subcell having a top contact connected to the terminal of first polarity. The solar cell assembly further includes a second semiconductor body disposed adjacent to the first semiconductor body composed of different layers than the first semiconductor body and including a tandem vertical stack of at least a first upper, a second, third and a fourth bottom solar subcells, the fourth bottom subcell having a bottom contact connected to the terminal of second polarity. The fourth subcell of the first semiconductor body is connected in a series electrical circuit with the fourth subcell of the second semiconductor body.

Some implementations include one or more of the following features. For example, in some cases, the upper first subcell of the first semiconductor body is composed of indium gallium phosphide (InGaP); the second solar subcell of the first semiconductor body is disposed adjacent to and lattice matched to said upper first subcell, the second solar subcell composed of aluminum gallium arsenide (AlGaAs) or indium gallium arsenide phosphide (InGaAsP), and the third subcell is the bottom subcell of the first semiconductor body and is lattice matched to said second subcell and is composed of indium gallium arsenide (In)GaAs.

In some instances, the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum gallium arsenide (AlGaAs); and the third subcell is disposed adjacent to and lattice matched to said second subcell and is composed of indium gallium arsenide (In)GaAs.

In some cases (e.g., for an assembly having two subassemblies), the short circuit density ($J_{sc}$/cm$^2$) of each of the first and second subcells is approximately 12 mA/cm$^2$. In other instances (e.g., for an assembly having three subassemblies), the short circuit density ($J_{sc}$/cm$^2$) of each of the first, second and third middle subcells is approximately 10 mA/cm$^2$. The short circuit density ($J_{sc}$/cm$^2$) of the bottom subcell in the foregoing cases can be approximately greater than 24 mA/cm$^2$. However, the short circuit densities ($J_{sc}$/cm$^2$) may have different values in some implementations.

In some embodiments, the fourth subcell is germanium.

In some embodiments, the fourth subcell is InGaAs, GaAsSb, InAsP, InAlAs, or SiGeSn, InGaAsN, InGaAsNSb, InGaAsNBi, InGaAsNSbBi, InGaSbN, InGaBiN. InGaSb-BiN.

In some embodiments, the second subcell has a band gap of approximately 1.73 eV and the upper first subcell has a band gap of approximately 2.10 eV.

In some embodiments, the upper first subcell is composed of indium gallium aluminum phosphide; the second solar subcell includes an emitter layer composed of indium gallium phosphide or aluminum gallium arsenide, and a base layer composed of aluminum gallium arsenide; the third solar subcell is composed of indium gallium arsenide; and the fourth subcell is composed of germanium.

In some embodiments, there further comprises a distributed Bragg reflector (DBR) layer adjacent to and between the third and the fourth solar subcells and arranged so that light can enter and pass through the third solar subcell and at least a portion of which can be reflected back into the third solar subcell by the DBR layer.

In some embodiments, the distributed Bragg reflector layer is composed of a plurality of alternating layers of lattice matched materials with discontinuities in their respective indices of refraction.

In some embodiments, the difference in refractive indices between alternating layers is maximized in order to minimize the number of periods required to achieve a given reflectivity, and the thickness and refractive index of each period determines the stop band and its limiting wavelength.

In some embodiments, the DBR layer includes a first DBR layer composed of a plurality of n type or p type $Al_xGa_{1-x}As$ layers, and a second DBR layer disposed over the first DBR layer and composed of a plurality of n type or p type $Al_yGa_{1-y}As$ layers, where $0<x<1$, $0<y<1$, and y is greater than x.

In another aspect, the present disclosure provides a five junction solar cell comprising a pair of semiconductor bodies, each body having a different sequence of semiconductor layers but each body including an upper first solar subcell composed of a semiconductor material having a first band gap; a substantially identical second solar subcell adjacent to said first solar subcell and composed of a semiconductor material having a second band gap smaller than the first band gap and being lattice matched with the upper first solar subcell; a substantially identical third solar subcell adjacent to said second solar subcell and composed of a semiconductor material having a third band gap smaller than the second band gap and being lattice matched with the second solar subcell; and a substantially identical fourth solar subcell adjacent to and lattice matched to said third solar subcell and composed of a semiconductor material having a fourth band gap smaller than the third band gap; wherein the average band gap of all four subcells (i.e., the sum of the four band gaps of each subcell divided by four) is greater than 1.44 eV.

In another aspect, the present disclosure provides a method of manufacturing a five junction solar cell assembly comprising providing two germanium substrates; growing on each germanium substrate a sequence of layers of semiconductor material using a semiconductor disposition process to form a solar cell comprising a plurality of subcells including a third subcell disposed over the substrate and having a band gap of approximately 1.41 eV, a second subcell disposed over the third subcell and having a band gap in the range of approximately 1.65 to 1.8 eV and an upper first subcell disposed over the second subcell and having a band gap in the range of 2.0 to 2.20 eV.

In some embodiments, there further comprises (i) a back surface field (BSF) layer disposed directly adjacent to the bottom surface of the third subcell, and (ii) at least one distributed Bragg reflector (DBR) layer directly below the BSF layer so that light can enter and pass through the first, second and third subcells and at least a portion of which be reflected back into the third subcell by the DBR layer.

In some embodiments, the fourth (i.e., bottom) subcell of each of the solar cell subassemblies is composed of germanium. The indirect band gap of the germanium at room temperature is about 0.66 eV, while the direct band gap of germanium at room temperature is 0.8 eV. Those skilled in the art with normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. For example, the fourth subcell may be composed of InGaAs, GaAsSb, InAsP, InAlAs, or SiGeSn, or other III-V or II-VI compound semiconductor materials.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
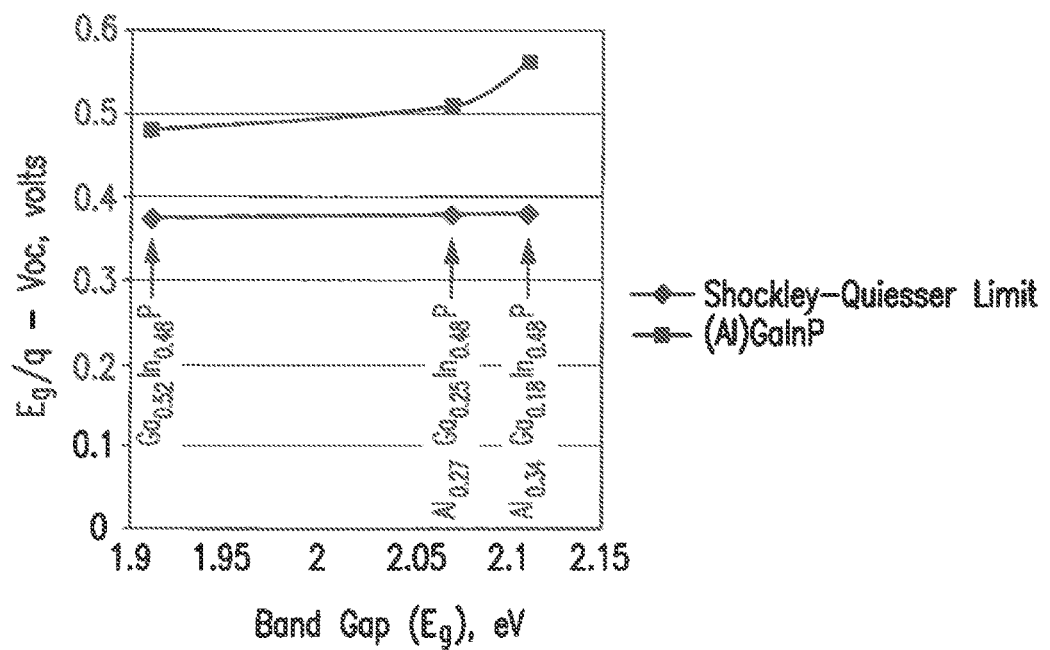
FIG. 1 is a graph representing the BOL value of the parameter $E_g/q-V_{oc}$ at 28° C. plotted against the band gap of certain ternary and quaternary materials defined along the x-axis.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which are to be the "top" subcells facing the solar radiation in the final deployment configuration, are deposited or grown on a growth substrate prior to depositing or growing the lower band gap subcells, following which the growth substrate is removed leaving the epitaxial structure.

"Layer" refers to a relatively planar sheet or thickness of semiconductor or other material.

The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electro-optical semiconductor device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the non-inverted or "upright" solar cells of the present disclosure. However, more particularly, the present disclosure is directed to the fabrication of a multijunction lattice matched solar cell assembly formed from the interconnection of two discrete and distinct subassemblies. More specifically, however, in some embodiments, the present disclosure relates to multi-junction solar cell subassemblies with direct band gaps in the range of 2.0 to 2.15 eV (or higher) for the top subcell, and (i) 1.65 to 1.8 eV, and (ii) 1.41 eV for the middle subcells, and 0.6 to 0.8 eV direct or indirect band gaps, for the bottom subcell, respectively, and the connection of two or more such subassemblies to form a solar cell assembly.

As described in greater detail, the present application notes that interconnecting two or more spatially split multijunction solar cell subassemblies can be advantageous. The spatial split can be provided for multiple solar cell subassemblies monolithically formed on the same substrate. Alternatively, the solar cell subassemblies can be fabricated as separate semiconductor chips that can be coupled together electrically.

In general terms, a solar cell assembly in accordance with one aspect of the present disclosure, can include a terminal of first polarity and a terminal of second polarity. The solar cell assembly includes a first semiconductor subassembly including a tandem vertical stack of at least a first upper, a second, third and fourth bottom solar subcells, the first upper subcell having a top contact connected to the terminal of first polarity. A second semiconductor subassembly is disposed adjacent to the first semiconductor subassembly and includes a tandem vertical stack of at least a first upper, a second, third, and fourth bottom solar subcells, the fourth bottom subcell having a back side contact connected to the terminal of second polarity. The fourth subcell of the first semiconductor subassembly is connected in a series electrical circuit with the third subcell of the second semiconductor subassembly. Thus, a five-junction solar assembly is assembled from two different four-junction solar cell subassemblies.

In some cases, the foregoing solar cell assembly can provide increased photoconversion efficiency in a multijunction solar cell for outer space or other applications over the operational life of the photovoltaic power system.

Another aspect of the present disclosure is that to provide a four junction solar cell assembly composed of spatially separated solar cell subassemblies, the average band gap of all four subcells (i.e., the sum of the four band gaps of each subcell divided by 4) in each solar cell subassembly being greater than 1.44 eV.

Another descriptive aspect of the present disclosure is to characterize the fourth subcell as being composed of an indirect or direct band gap material such that the lowest direct band gap is greater than 0.75 eV, in some embodiments.

In some embodiments, the fourth subcell in each solar cell subassembly is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN. InGaSbBiN or other III-V or II-VI compound semiconductor material.

The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV.

The recitation that "the fourth subcell has a direct band gap of greater than 0.75 eV" is therefore expressly meant to include germanium as a possible semiconductor for the fourth subcell, although other semiconductor materials can be used as well.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Prior to discussing the specific embodiments of the present disclosure, a brief discussion of some of the issues associated with the design of multijunction solar cells, and in particular metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes and suited for specific applications such as the space environment where the efficiency over the entire operational life is an important goal, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell at the beginning of life or the end of life. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, in a given environment over the operational life, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and "unexpected results", and constitute an "inventive step" in designing and specifying a solar cell to operate in a predetermined environment (such as space), not only at the beginning of life, but over the entire defined operational lifetime.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One aspect of the present disclosure relates to the use of aluminum in the active layers of the upper subcells in a multijunction solar cell. The effects of increasing amounts of aluminum as a constituent element in an active layer of a subcell affects the photovoltaic device performance. One measure of the "quality" or "goodness" of a solar cell subcell or junction is the difference between the band gap of the semiconductor material in that subcell or junction and the $V_{oc}$, or open circuit voltage, of that same junction. The smaller the difference, the higher the $V_{oc}$ of the solar cell junction relative to the band gap, and the better the performance of the device. $V_{oc}$ is very sensitive to semiconductor material quality, so the smaller the $E_g/q - V_{oc}$ of a device, the higher the quality of the material in that device. There is a theoretical limit to this difference, known as the Shockley-Queisser limit. That is the best that a solar cell junction can be under a given concentration of light at a given temperature.

The experimental data obtained for single junction (Al) GaInP solar cells indicates that increasing the Al content of the junction leads to a larger $V_{oc}$-$E_g$/q difference, indicating that the material quality of the junction decreases with increasing Al content. FIG. 1 shows this effect. The three compositions cited in the Figure are all lattice matched to GaAs, but have differing Al composition. As seen by the different compositions represented, with increasing amount of aluminum represented by the x-axis, adding more Al to the semiconductor composition increases the band gap of the junction, but in so doing also increases $V_{oc}$-$E_g$/q. Hence, we draw the conclusion that adding Al to a semiconductor material degrades that material such that a solar cell device made out of that material does not perform relatively as well as a junction with less Al.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to, in one embodiment, a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells using commercially available equipment and established high-volume fabrication processes, as contrasted with merely academic expositions of laboratory or experimental results.

Figure 2A:
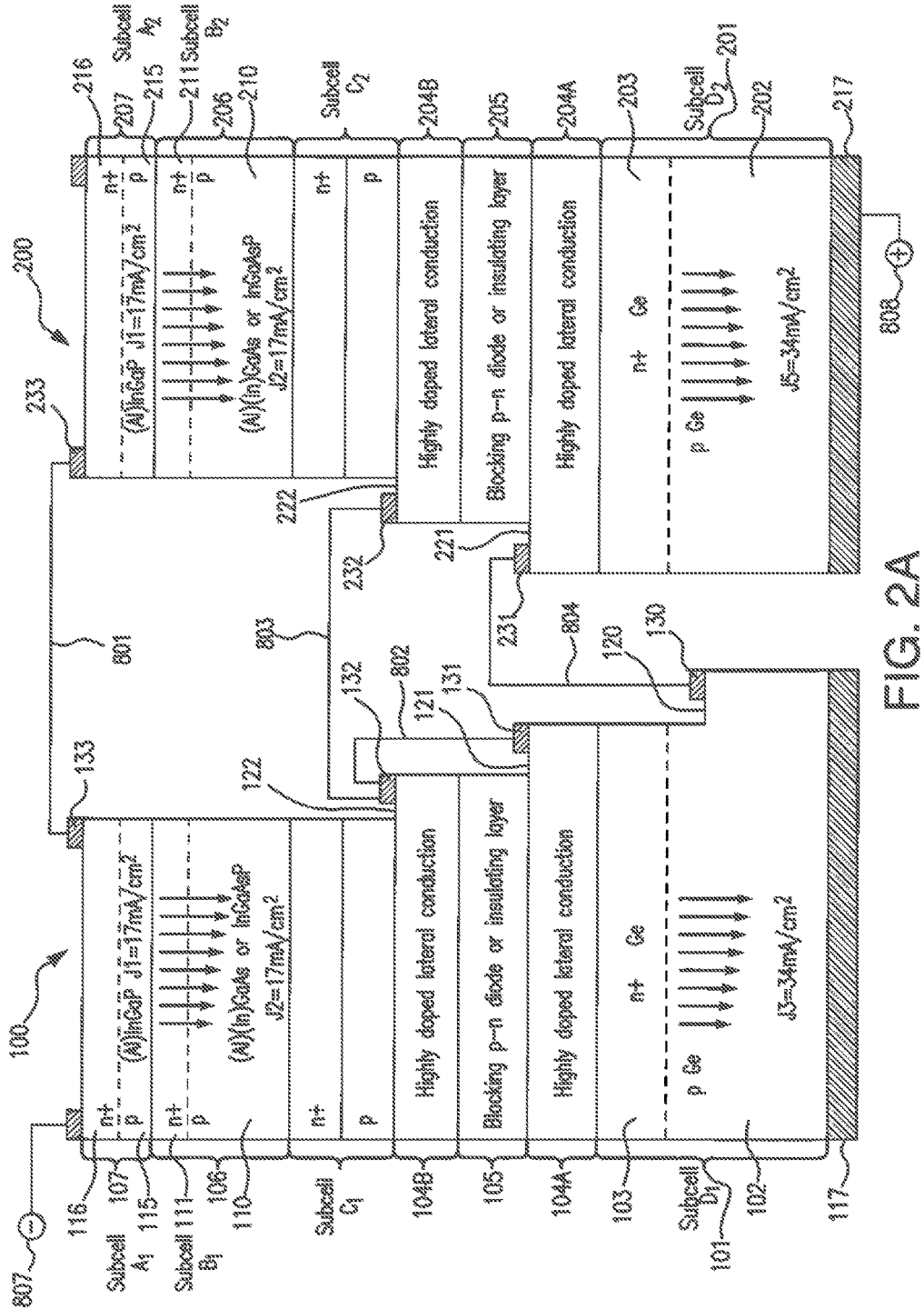
FIG. 2A is a cross-sectional view of a first embodiment of a five junction solar cell assembly after several stages of fabrication including the growth of certain semiconductor layers on the growth substrate of up to the contact layer and etching contact steps on lower levels according to the present disclosure.

Turning to the fabrication of the multijunction solar cell assembly of the present disclosure, and in particular a five-junction solar cell assembly, FIG. 2A is a cross-sectional view of a first embodiment of a solar cell assembly comprising two four junction solar cell subassemblies 100 and 200 after several stages of fabrication including the growth of certain semiconductor layers on the growth substrate, and formation of grids and contacts on the contact layers of the semiconductor bodies, and interconnection of the two subassemblies 100 and 200.

As illustrated in FIG. 2A, similar to that presented in related application Ser. No. 15/213,594, a first solar cell subassembly 100 includes multiple solar subcells in a tandem stack. In the illustrated example, the subassembly 100 includes an upper first subcell 107 (Subcell $A_1$), a second middle solar subcell 106 (Subcell $B_1$) disposed adjacent to and lattice matched to the upper first subcell 107, a third middle subcell 108 (Subcell $C_1$), and a bottom subcell 101 (Subcell $D_1$) lattice matched to the third subcell 105. In the illustrated example, the subcells 101, 105, 106, 107 are configured so that the short circuit current densities of the upper first subcell 107, the second subcell 106, and the third subcell 105 have a substantially equal predetermined first value (J1=J2=J3), and the short circuit current density (J4) of the bottom subcell 101 is at least twice that of the predetermined first value.

In the example of FIG. 2A, the upper first subcell 107 is composed of (aluminum) indium gallium phosphide ((Al)InGaP), the second solar subcell 106 is composed of (aluminum) gallium arsenide ((Al)GaAs) or indium gallium arsenide phosphide (InGaAsP), and the bottom subcell 101 is composed of germanium (Ge) or gallium arsenide (GaAs). Each of the subcells includes a respective junction formed, respectively, by p type and n+ type regions of the semiconductor material for the particular subcell. Thus, for example, the upper subcell 107 includes adjacent p and n+ regions 115, 116 of (Al)InGaP. Likewise, the second subcell 106 includes adjacent p and n+ regions 110, 111 of AlGaAs or InGaAsP. Similarly, the bottom subcell 101 includes adjacent p and n+ regions 102, 103 of Ge or GaAs.

The first solar cell subassembly 100 of FIG. 2A can include additional semiconductor layers as well, such as highly doped lateral conduction layers 104A, 104B and a blocking p-n diode or insulating layer 105 disposed between the first and second subcells 107, 106. In this case, the blocking p-n diode or insulating layer 105 is adjacent to, and sandwiched between, the highly doped lateral conduction layers 104A, 104B. Thus, the first highly doped lateral conduction layer 104A is disposed adjacent to and beneath the blocking p-n diode or insulating layer 105. Likewise, the blocking p-n diode or insulating layer 105 is disposed adjacent to and beneath the second highly doped lateral conduction layer 104B.

In some implementations, such as a triple junction solar cell, the band gap of the first upper subcell 107 is in the range of 1.85 to 1.95 eV, the band gap of the second subcell 106 is in the range of 1.4 to 1.5 eV, and the band gap of the bottom subcell 201 is in the range of 0.6 to 0.8 eV.

In some implementations, in a four junction device, the band gap of the first upper subcell 107 is 2.0 to 2.2 eV, the band gap of the second subcell 106 is in the range of 1.65 to 1.8 eV, and the band gap of the third solar cell is 1.41 eV, and the band gap of the bottom subcell 201 is in the range of 0.6 to 0.8 eV. In such an implementation, the average band gap of the top three subcells is at least 1.44 eV.

The solar cell subassembly 100 also includes electrically conductive contacts (see, e.g., metallization 117) on the bottom of the subcell 101.

As described in greater detail below, different layers in the solar cell subassembly 100 can be connected electrically to one another. Further in some cases, two or more spatially separated multijunction solar cell subassemblies can be connected together electrically, for example, through electrically conductive interconnects. In order to provide access to the various layers so as to facilitate such connections, various ones of the layers in the solar cell subassembly 100 can be exposed partially. Thus, as shown in the example of FIG. 1A, various layers are partially exposed, for example, using standard photolithographic etching techniques to etch from the top surface of the subassembly 100 to the particular contact layer(s) 120, 121, 122 of interest (i.e., the bottom contact layer 122 for the second subcell 106; the bottom contact layer 121 for blocking p-n diode or insulating layer 105; and the bottom contact layer 120 for the n+ layer 103 of the bottom subcell 101).

On the right hand side of FIG. 2A there is illustrated the second solar cell subassembly 200, which is similar to the solar cell subassembly 100. The second solar cell subassembly 200 can have substantially the same sequence of semiconductor layers with the same compositions and bandgaps as the corresponding layers in the first solar cell subassembly 100. Thus, the solar cell subassembly 200 also includes multiple subcells in a tandem stack. In the illustrated example of FIG. 2A, the second solar cell subassembly 200 includes an upper first subcell 207 (Subcell A2), a second solar subcell 206 (Subcell B2) disposed adjacent to and lattice matched to the upper first subcell 207, and a bottom subcell 201 (Subcell D) lattice matched to the second subcell 206. As with the first solar cell subassembly 100, the subcells 201, 206, 207 of the second solar cell subassmbly can be configured so that the short circuit current densities of the upper first subcell 207 and the second subcell 206 have a substantially equal predetermined first value (J1=J2), and the short circuit current density (J3) of the bottom subcell 201 is at least twice that of the predetermined first value.

Referring to example of FIG. 2A, the upper first subcell 207 is composed of (aluminum) indium gallium phosphide ((Al)InGaP), the second solar subcell 206 is composed of (aluminum) gallium arsenide ((Al)GaAs) or indium gallium arsenide phosphide (InGaAsP), and the bottom subcell 201 is composed of germanium (Ge) or other suitable semiconductor material. Each of the subcells includes a respective junction formed, respectively, by p type and n+ type regions of the semiconductor material for the particular subcell. Thus, for example, the upper subcell 207 includes adjacent p and n+ regions 215, 216 of (Al)InGaP. Likewise, the second subcell 206 includes adjacent p and n+ regions 210, 211 of (Al)GaAs or InGaAsP. Similarly, the bottom subcell 201 includes adjacent p and n+ regions 202, 203 of Ge or other suitable semiconductor material.

The second solar cell subassembly 200 also can include a blocking p-n diode or insulating layer 205 sandwiched between first and second highly doped lateral conduction layers 204A, 204B. Electrically contacts (e.g., 216 and 217) can be provided, respectively, making electrical contact with the top and bottom subcells 207, 201.

In order to provide access to the various layers in the second solar cell subassembly 200, various ones of the layers can be exposed partially. Thus, as shown in the example of FIG. 2A, various surfaces are partially exposed, for example, using standard photolithographic etching techniques to etch from the top surface of the semiconductor body 200 to the particular contact layer 221, 222 of interest (i.e., the bottom contact layer 222 for the second subcell 206; and the bottom contact layer 221 for blocking p-n diode or insulating layer 205).

FIG. 2A also illustrates the metal contact pads on the ledges 120, 121, 122, 221 and 222 depicted in FIG. 2A.

A metal contact pad 132 is deposited on the surface of the ledge of 122 which exposes a portion of the top surface of the lateral conduction layer 104b. This pad 132 allows electrical contact to be made to the bottom of the stack of subcells $A_1$ through $C_1$ on subassembly 100.

Similarly, a metal contact pad 232 is deposited on the surface of the ledge of 222 which exposes a portion of the top surface of the lateral conduction layer 204b. This pad 232 allows electrical contact to be made to the bottom of the stack of subcells $A_2$ through $C_2$ on subassembly 200.

A metal contact pad 131 is deposited on the surface of the ledge of 121 which exposes a portion of the top surface of the lateral conduction layer 104a. This pad 131 allows electrical contact to be made to the top of the subcell $D_1$.

A metal contact pad 231 is deposited on the surface of the ledge of 221 which exposes a portion of the top surface of the lateral conduction layer 204a. This pad 231 allows electrical contact to be made to the top of the subcell $D_2$.

A metal contact pad 130 is further provided on the surface of ledge 120 which allows electrical contact to be made to the p-terminal of subcell $D_1$.

The foregoing multijunction solar cell subassemblies 100 or 200 can be fabricated, for example, in wafer-level processes and then diced into individual semiconductor chips.

The various semiconductor layers can be grown, one atop another, using known growth techniques (e.g., MOCVD) as discussed above.

Each solar cell subassembly 100, 200 also can include grid lines, interconnecting bus lines, and contact pads. FIG. 2 of Ser. No. 15/213,594 illustrates an example of a top view of the solar cell subassembly 100, which includes grid lines 140, interconnecting bus lines 142, and electrically conductive contacts 143, 144, 145, 146. The solar cell subassembly 200 can include similar grid lines, interconnecting bus lines, and contact pads. The geometry and number of the grid lines, bus lines and/or contacts may vary in other implementations.

In some embodiments, the bottom subcell $D_1$ and $D_2$ is germanium, while in other embodiments the fourth subcell is InGaAs, GaAsSb, InAsP, InAlAs, or SiGeSn, InGaAsN, InGaAsNSb, InGaAsNBi, InGaAsNSbBi, InGaSbN, InGaBiN. InGaSbBiN or other III-V or II-VI compound semiconductor material.

The bottom subcell $D_1$ and $D_2$ further includes, for example, a highly doped n-type Ge emitter layer 102, 103, and an n-type indium gallium arsenide ("InGaAs") nucleation layer. The nucleation layer is deposited over the substrate, and the emitter layer 103, 203 is formed in the substrate by diffusion of deposits into the Ge substrate, thereby forming the n-type Ge layer 103, 203.

In the solar cell subassemblies 100 and 200 of FIG. 2A, a highly doped lateral conduction layer 104A, 204A is deposited over layer 103, 203, and a blocking p-n diode or insulating layer 105, 205 is deposited over the layer 104A, 204A, respectively. A highly doped lateral conduction layer 602d is then deposited over later 602c.

Figure 2B:
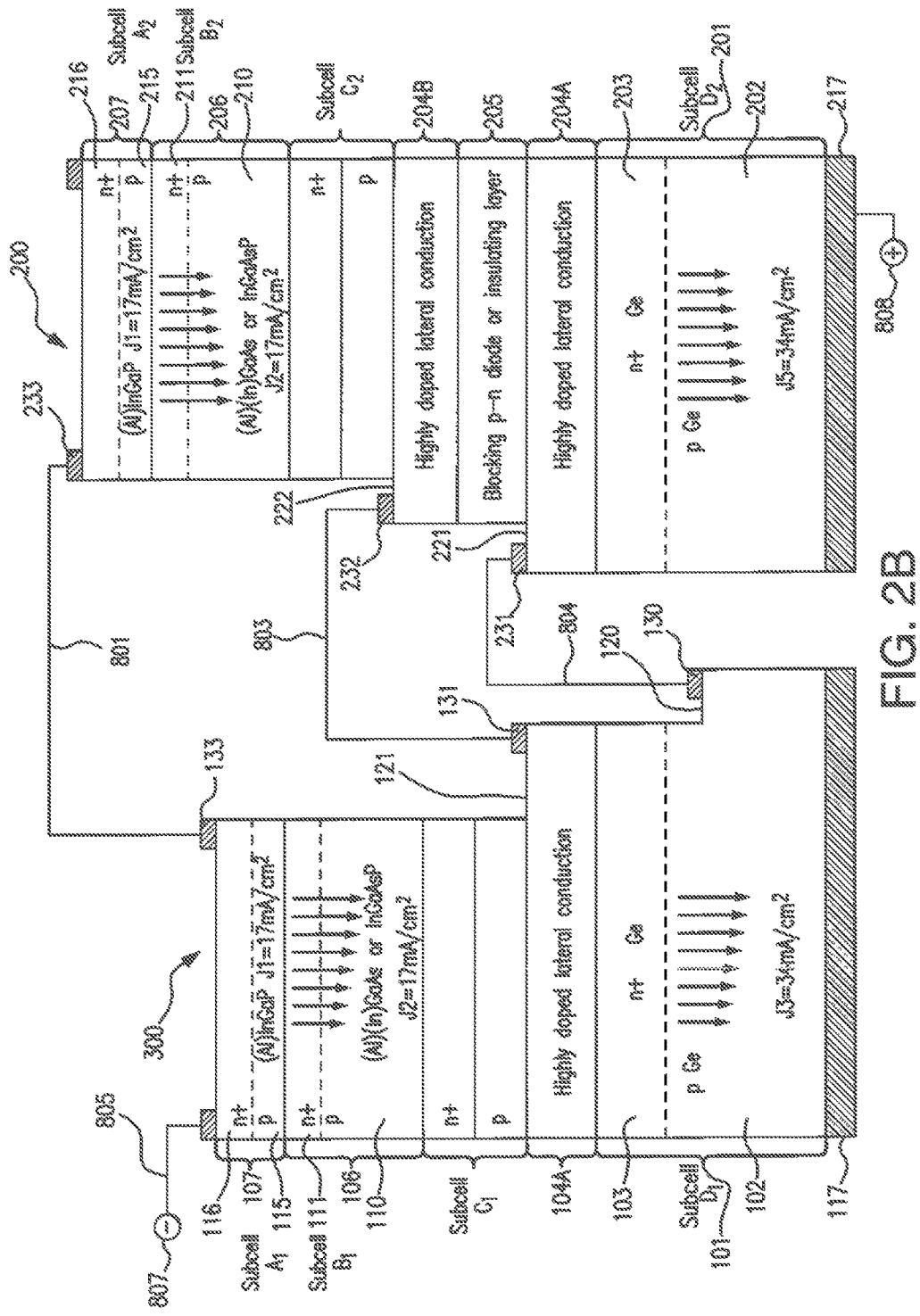
FIG. 2B is a cross-sectional view of a second embodiment of a five junction solar cell assembly after several stages of fabrication including the growth of certain semiconductor layers on the growth substrate of up to the contact layer and etching contact steps on lower levels according to the present disclosure.

Turning to the fabrication of the multijunction solar cell assembly of the present disclosure, and in particular a five-junction solar cell assembly, FIG. 2B is a cross-sectional view of a second embodiment of a solar cell assembly comprising two four junction solar cell subassemblies 300 and 200 after several stages of fabrication including the growth of certain semiconductor layers on the growth substrate, and formation of grids and contacts on the contact layers of the semiconductor bodies, and interconnection of the two subassemblies 300 and 200.

The second embodiment depicted in FIG. 2B includes a left subassembly 300 which has a sequence of layers which is substantially identical to subassembly 100 of FIG. 2A, except that layers 105 and 104B are omitted, while the right subassembly 200 depicted in FIG. 2B is identical to subassembly 200 of FIG. 2A. Therefore in the interest of brevity of this disclosure, the description of the identical layers in left subassembly 300 and right subassembly 200 will not be repeated here.

As with the first solar cell subassembly 100 or 300, the subcells $A_2$, $B_2$, $C_2$ of the second solar cell subassembly 200 can be configured so that the short circuit current densities of the three subcells $A_2$, $B_2$, $C_2$ have a substantially equal predetermined first value (J1=J2=J3), and the short circuit current density (J4) of the bottom subcell E is at least twice that of the predetermined first value.

The foregoing multijunction solar cell subassemblies 100, 200, or 300 can be fabricated, for example, in one or two distinct wafer-level processes and then diced into individual semiconductor chips. The various semiconductor layers can be grown, one atop another, using known growth techniques (e.g., MOCVD) as discussed above.

Each solar cell subassembly 100, 200, 300 also can include grid lines, interconnecting bus lines, and contact pads. The geometry and number of the grid lines, bus lines and/or contacts may vary in other implementations.

As previously mentioned, two (or more) solar cell subasemblies (e.g., 300 and 200) can be connected together electrically. For example, as shown in FIGS. 2A and 2B, conductive (e.g., metal) interconnections 801, 802, 803, and 804 can be made between different layers of the solar cell subassemblies 100 and 200, and 300 and 200. Some of the interconnections are made between different layers of a single one of the solar cell subassemblies, whereas others of the interconnections are made between the two different solar cell subassemblies. Thus, for example, the interconnection 801 electrically connects together the metal contacts 133 and 233 of the first and second solar cell subassemblies 100, 300 and 200 respectively. In particular, interconnection 803 connects together a contact 132 on the lateral conduction layer 104b of the first solar cell subassembly 100 to a contact 232 on the lateral conduction layer 204b of the second solar cell subassembly 200. Similarly, the interconnection 804 connects together a contact 130 on the p-base layer 102 of the first solar cell subassembly 100 to a contact 231 on the lateral conduction layer 204a of the second solar cell subassembly 200. Likewise, the interconnection 802 connects together a contact 132 on the lateral conduction layer 104b of the first solar cell subassembly 100 to a contact 131 on the lateral conduction layer 104a of the first solar cell subassembly 100.

In some instances, multiple electrically conductive (e.g., metal) contacts can be provided for each of the respective contacts of the solar cell subassemblies 100, 200. This allows each of the interconnections 801-804 to be implemented by multiple interconnections between the solar cell subassembly layers rather than just a single interconnection.

As noted above, the solar cell assembly includes a first electrical contact of a first polarity and a second electrical contact of a second polarity. In some embodiments, the first electrical contact 807 is connected to the metal contact 107 on the first solar cell subassembly 100, 300 by an interconnection 805, and the second electrical contact 808 is connected to the back metal contact 217 of subcell $D_2$ of the second solar cell subassembly 200.

As illustrated in FIG. 2B, two or more solar cell subassemblies can be connected electrically as described above to obtain a multijunction (e.g. a four-, five- or six-junction) solar cell assembly. In FIG. 2B, the top side (n-polarity) conductivity contact 807 and bottom side (p-polarity) conductive contact 808 for the solar cell assembly are schematically depicted respectively, at the left and right-hand sides of the assembly.

In the example of FIG. 2B, one solar cell subassembly 300 includes an upper subcell $A_1$, two middle subcells $B_1$, $C_1$ and a bottom subcell $D_1$. The other solar cell subassembly 200 includes an upper subcell $A_2$, two middle subcells $B_2$, $C_2$ and a bottom subcell $D_2$. In some implementations, each solar cell subassembly 300, 200 has band gaps in the range of 2.0 to 2.20 eV (or higher) for the top subcell, and (i) 1.65 to 1.8, and (ii) 1.41 eV for the middle subcells, and 0.6 to 0.8 eV, for the bottom subcell, respectively, Further, in some embodiments, the average band gap of all four subcells (i.e., the sum of the four band gaps of each subcell divided by four) in a given solar cell subassembly 500 or 700 is greater than 1.44 eV. Other band gap ranges may be appropriate for some implementations.

In some instances, the fourth (i.e., bottom) subcell is composed of germanium. The indirect band gap of the germanium at room temperature is about 0.66 eV, while the direct band gap of germanium at room temperature is 0.8 eV. Those skilled in the art with normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. For example, the fourth subcell may be composed of InGaAs, GaAsSb, InAsP, InAlAs, or SiGeSn, or other III-V or II-VI compound semiconductor materials.

Figure 2C:
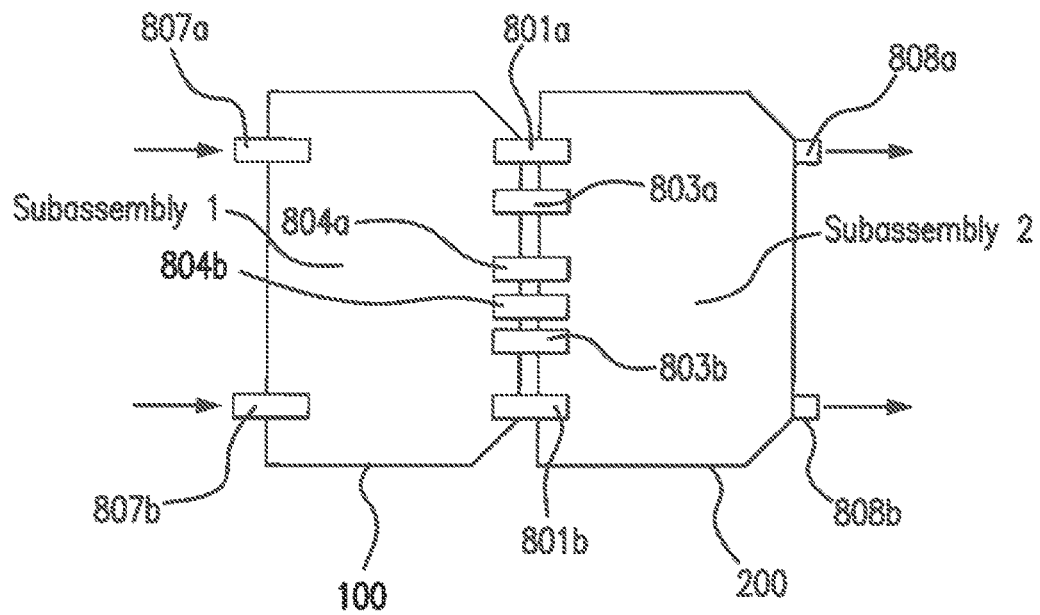
FIG. 2C is a top plan view of two subassemblies being connected together to form a single solar cell assembly.

FIG. 2C is a top plan view of the two subassemblies 300 and 200 being connected together to form a single solar cell assembly. As illustrated in FIG. 2C, two (or in other embodiments, more) solar cell subassemblies can be connected electrically as described above to obtain a multi-junction (e.g., a four-, five- or six-junction) solar cell assembly. In FIG. 2C, the top side (n) conductive contacts 807a, 807b and bottom side (p) conductive contacts 808a, 808b for the solar cell assembly are visible, respectively, at the left and right-hand sides of the assembly, corresponding to contacts 807 and 808 depicted in FIG. 2B.

Similarly, interconnects 801, 803 and 804 shown in FIG. 2B are shown in an embodiment of two parallel interconnects, i.e., 801a and 801b for 801, 803a and 803b for 803, and 804a and 805b for 804.

Figure 3:
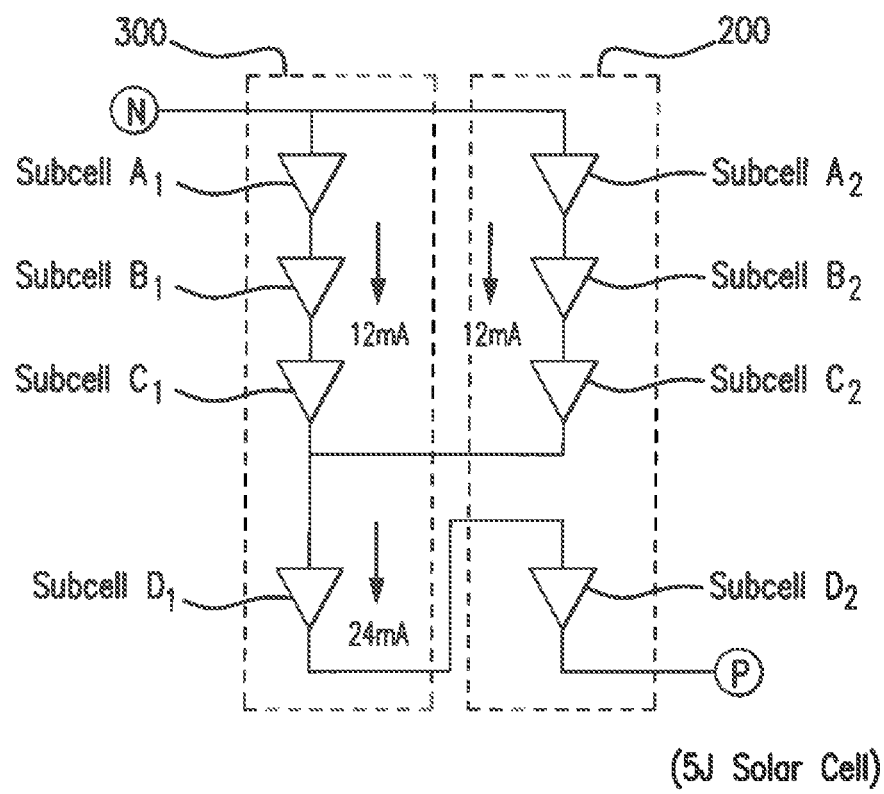
FIG. 3 is a schematic diagram of the five junction solar cell assembly of FIG. 2B.

FIG. 3 is a schematic diagram of the five junction solar cell assembly of FIG. 2B.

In some implementations of a five-junction solar cell assembly, such as in the example of FIG. 3, the short circuit density ($J_{sc}$) of the upper first subcells ($A_1$, and $A_2$) and the middle subcells ($B_1$, $B_2$, $C_1$, $C_2$) is about 12 mA/cm$^2$, and the short circuit current density ($J_{sc}$) of the bottom subcells ($D_1$ and $D_2$) is about 34 mA/cm$^2$. Other implementations may have different values.

Some implementations provide that at least the base of at least one of the first, second or third solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first, second or third solar subcells also has a graded doping, i.e., the level of doping varies from one surface to the other throughout the thickness of the emitter layer. In some embodiments, the gradation in doping is linear or monotonically decreasing.

Figure 4:
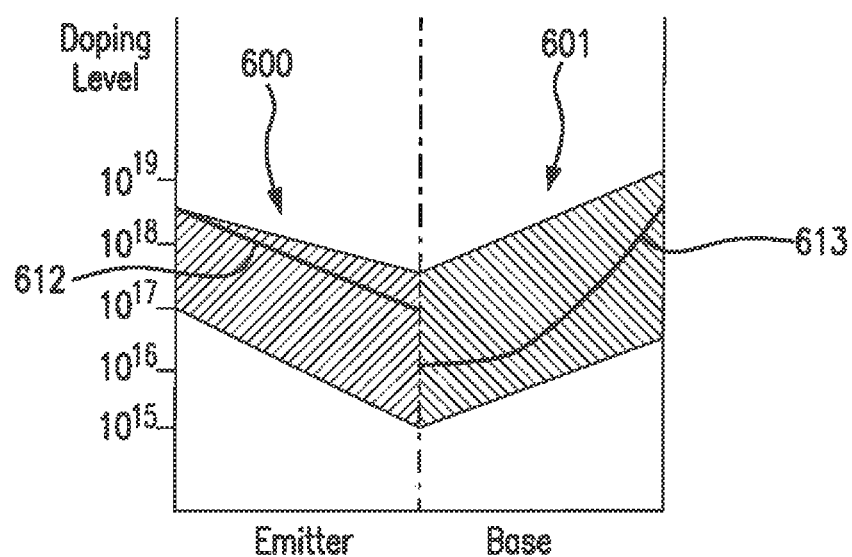
FIG. 4 is a graph of the doping profile in the base and emitter layers of a subcell in the solar cell according to the present disclosure.

As a specific example, the doping profile of the emitter and base layers may be illustrated in FIG. 4, which depicts the amount of doping in the emitter region and the base region of a subcell. N-type dopants include silicon, selenium, sulfur, germanium or tin. P-type dopants include silicon, zinc, chromium, or germanium.

In the example of FIG. 4, in some embodiments, one or more of the subcells have a base region having a gradation in doping that increases from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

The heavy line shown in FIG. 4 illustrates one embodiment of the base doping having an exponential gradation, and the emitter doping being linear.

Thus, the doping level throughout the thickness of the base layer may be exponentially graded from the range of $1 \times 10^{16}$ free carriers per cubic centimeter to $1 \times 10^{18}$ free carriers per cubic centimeter, as represented by the curve 603 depicted in the Figure.

Similarly, the doping level throughout the thickness of the emitter layer may decline linearly from $5 \times 10^{18}$ free carriers per cubic centimeter to $5 \times 10^{17}$ free carriers per cubic centimeter as represented by the curve 602 depicted in the Figure.

The absolute value of the collection field generated by an exponential doping gradient $\exp[-x/\lambda]$ is given by the constant electric field of magnitude $E=kT/q(1/\lambda))(\exp[-x_b/\lambda])$, where k is the Boltzman constant, T is the absolute temperature in degrees Kelvin, q is the absolute value of electronic change, and $\lambda$ is a parameter characteristic of the doping decay.

The efficacy of an embodiment of the doping arrangement present disclosure has been demonstrated in a test solar cell which incorporated an exponential doping profile in the three micron thick base layer a subcell, according to one embodiment.

The exponential doping profile taught by one embodiment of the present disclosure produces a constant field in the doped region. In the particular multijunction solar cell materials and structure of the present disclosure, the bottom subcell has the smallest short circuit current among all the subcells. Since in a multijunction solar cell, the individual subcells are stacked and form a series circuit, the total current flow in the entire solar cell is therefore limited by the smallest current produced in any of the subcells. Thus, by increasing the short circuit current in the bottom cell, the current more closely approximates that of the higher subcells, and the overall efficiency of the solar cell is increased as well. In a multijunction solar cell with approximately efficiency, the implementation of the present doping arrangement would thereby increase efficiency. In addition to an increase in efficiency, the collection field created by the exponential doping profile will enhance the radiation hardness of the solar cell, which is important for spacecraft applications.

Although the exponentially doped profile is the doping design which has been implemented and verified, other doping profiles may give rise to a linear varying collection field which may offer yet other advantages. For example, another doping profile may produce a linear field in the doped region which would be advantageous for both minority carrier collection and for radiation hardness at the end-of-life (EOL) of the solar cell. Such other doping profiles in one or more base layers are within the scope of the present disclosure.

The doping profile depicted herein are merely illustrative, and other more complex profiles may be utilized as would be apparent to those skilled in the art without departing from the scope of the present invention.

Some implementations provide that a quantum well structure is included in subcell C. Quantum well structures in multijunction solar cells are known from U.S. patent application Ser. No. 11/788,315, filed Apr. 18, 2007 hereby incorporated by reference.

In some embodiments, the plurality of quantum layers are "strained balanced" by incorporating alternating lower band gap (or larger lattice constant) compressively strained InGaAs and higher band gap (or smaller lattice constant) tensionally strained GaAsP layers so that the larger/smaller atomic lattices/layers of epitaxy balance the strain to keep the quantum well layers lattice matched to the substrate.

In some embodiments, the number of quantum well layers are between 100 and 300, which each layer being between 100 and 300 angstroms in thickness.

In some embodiments, the quantum well layers form an intermediate band gap layer between the emitter layer and the base layer of the second middle subcell.

In some embodiments, the total thickness of the quantum well layers is between two and four microns.

The present disclosure like that of the related parallel applications, U.S. patent application Ser. Nos. 14/828,206; 15/203,975; and Ser. No. 15/213,594, provides a multijunction solar cell that follows a design rule that one should incorporate as many high band gap subcells as possible to achieve the goal to increase the efficiency at high temperature EOL. For example, high band gap subcells may retain a greater percentage of cell voltage as temperature increases, thereby offering lower power loss as temperature increases. As a result, both high temperature beginning-of-life (HT-BOL) and HT-EOL performance of the exemplary multijunction solar cell, according to the present disclosure, may be expected to be greater than traditional cells.

The open circuit voltage ($V_{oc}$) of a compound semiconductor subcell loses approximately 2 mV per degree C. as the temperature rises, so the design rule taught by the present disclosure takes advantage of the fact that a higher band gap (and therefore higher voltage) subcell loses a lower percentage of its $V_{oc}$ with temperature. For example, a subcell that produces a 1.50V at 28° C. produces 1.50-42*(0.0023)=1.403V at 70° C. which is a 6.4% voltage loss, A cell that produces 0.25V at 28° C. produces 0.25-42*(0.0018)=0.174V at 70° which is a 30.2% voltage loss.

In view of different satellite and space vehicle requirements in terms of temperature, radiation exposure, and operational life, a range of subcell designs using the design principles of the present disclosure may be provided satisfying typical customer and mission requirements, and several embodiments are set forth hereunder, along with the computation of their efficiency at the end-of-life. The radiation exposure is experimentally measured using 1 MeV electron fluence per square centimeter (abbreviated in the text that follows as e/cm$^2$), so that a comparison can be made between the current commercial devices and embodiments of solar cells discussed in the present disclosure.

As an example, a low earth orbit (LEO) satellite will typically experience radiation equivalent to $5 \times 10^{14}$ e/cm$^2$ over a five year lifetime. A geosynchronous earth orbit (GEO) satellite will typically experience radiation in the range of $5 \times 10^{14}$ e/cm$^2$ to $1 \times 10$ e/cm$^2$ over a fifteen year lifetime.

For example, the cell efficiency (%) measured at room temperature (RT) 28° C. and high temperature (HT) 70° C., at beginning of life (BOL) and end of life (EOL), for a standard three junction commercial solar cell (e.g. a SolAero Technologies Corp. Model ZTJ), such as depicted in FIG. 2 of U.S. patent application Ser. No. 14/828,206, is as follows:

| Condition | Efficiency | |
| --- | --- | --- |
| BOL 28° C. | 29.1% | |
| BOL 70° C | 26.4% | |
| EOL 70° C | 23.4% | After 5E14 e/cm$^2$ radiation |
| EOL 70° C. | 22.0% | After 1E15 e/cm$^2$ radiation |

For the 5J solar cell assembly described in the present disclosure, the corresponding data is as follows:

| Condition | Efficiency | |
|---|---|---|
| BOL 28° C. | 30.6% | |
| BOL 70° C | 27.8% | |
| EOL 70° C | 26.6% | After 5E14 e/cm² radiation |
| EOL 70° C | 26.1% | After 1E15 e/cm² radiation |

The new solar cell has a slightly higher cell efficiency than the standard commercial solar cell (ZTJ) at BOL at 70° C. However, the solar cell described in the present disclosure exhibits substantially improved cell efficiency (%) over the standard commercial solar cell (ZTJ) at 1 MeV electron equivalent fluence of $5 \times 10^{14}$ e/cm², and dramatically improved cell efficiency (%) over the standard commercial solar cell (ZTJ) at 1 MeV electron equivalent fluence of $1 \times 10^{15}$ e/cm².

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalised energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) is used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. A widely accepted total mission equivalent fluence for a geosynchronous satellite mission of 15 year duration is 1 MeV $1 \times 10^{15}$ electrons/cm².

The exemplary solar cell described herein may require the use of aluminum in the semiconductor composition of each of the top two subcells. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q - V_{oc}$ metric. In short, increased BOL $E_g/q - V_{oc}$ may be the most problematic shortcoming of aluminum containing subcells; the other limitations can be mitigated by modifying the doping schedule or thinning base thicknesses.

It will be understood that each of the elements described above, or two or more together, also may find a useful application in other types of structures or constructions differing from the types of structures or constructions described above.

Although described embodiments of the present disclosure utilizes a vertical tandem stack of four subcells, various aspects and features of the present disclosure can apply to tandem stacks with fewer or greater number of subcells, i.e. two junction cells, three junction cells, five junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n+ type InGaAlP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A solar cell module including a terminal of first polarity and a terminal of second polarity comprising:
a first semiconductor body including a tandem vertical stack of at least a first upper, a second and a bottom solar subcells; and
a second semiconductor body disposed adjacent and parallel to the first semiconductor body and including a tandem vertical stack of at least a first upper, a second and a bottom solar subcells substantially identical to that of the first semiconductor body, the first upper subcell of the first and second semiconductor bodies having a top contact connected to the terminal of first polarity, the third bottom subcell of the second semiconductor body having a bottom contact connected to the terminal of second polarity;
wherein the third subcell of the first semiconductor body is connected in a series electrical circuit with the third subcell of the second semiconductor body so that the interconnection of subcells of the first and second semiconductor bodies forms at least a four junction solar cell; and
wherein the sequence of layers in the first and the second semiconductor bodies are different.

2. A module as defined in claim 1, wherein the upper first subcell of the first and second semiconductor bodies is composed of indium gallium phosphide (InGaP); the second solar subcell of the first and second semiconductor bodies disposed adjacent to and lattice matched to said upper first subcell, the second solar subcell composed of aluminum gallium arsenide (AlGaAs) or indium gallium arsenide phosphide (InGaAsP), and the third subcell is the bottom subcell of each of the semiconductor bodies and is lattice matched to said second subcell and is composed of germanium (Ge).

3. A module as defined in claim 1, wherein the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum gallium arsenide (AlGaAs); the third subcell is disposed adjacent to and lattice matched to said second subcell and is composed of gallium arsenide (GaAs), and the bottom subcell of the first and second semiconductor body is lattice matched to said second subcell and is composed of germanium (Ge).

4. A module as defined in claim 1, wherein the first semiconductor body further comprises a first highly doped lateral conduction layer disposed adjacent to and beneath the second solar subcell.

5. A module as defined in claim 1, wherein the second semiconductor body further comprises a second highly doped lateral conduction layer disposed adjacent to and beneath the second solar subcell, and a blocking p-n diode or insulating layer disposed adjacent to and beneath the second highly doped lateral conduction layer, and a third highly doped lateral conduction layer disposed adjacent to and beneath the blocking p-n diode or insulating layer.

6. A module as defined in claim 1, wherein the short circuit density ($J_{sc}$) of each of the bottom subcells is at least twice that of the first and second subcells.

7. A module as defined in claim 1, wherein the short circuit current density ($J_{sc}$) of the first and second subcells are each approximately 17 mA/cm$^2$, and the short circuit current density ($J_{sc}$) of each of the bottom subcells is approximately 34 mA/cm$^2$.

8. A module as defined in claim 3, wherein the short circuit current density ($J_{sc}$) of the first, second and third middle subcells are each approximately 11 mA/cm$^2$.

9. A module as defined in claim 8, wherein the short circuit current density ($J_{sc}$) of each of the bottom subcells is approximately 22.6 mA/cm$^2$.

10. A module as defined in claim 3, wherein at least the base of at least one of the first, second or third solar subcells has a graded doping.

11. A module as defined in claim 1, further comprising a third middle solar subcell composed of gallium arsenide (GaAs) disposed adjacent to and beneath the second solar subcell, and above the bottom solar subcell.

12. A module as defined in claim 1, further comprising a first conductive interconnect extending between the contact layer of the first upper subcell of the first semiconductor body to the contact layer of the first upper subcell of the second semiconductor body.

13. A module as defined in claim 11, further comprising a second conductive interconnect extending between the bottom contact layer of the third subcell of the first semiconductor body to the bottom contact layer of the third subcell of the second semiconductor body.

14. A module as defined in claim 13, further comprising a third conductive interconnect extending between the bottom contact layer of the bottom subcell of the first semiconductor body to the top contact layer of the bottom subcell of the second semiconductor body.

15. A module as defined in claim 1, further comprising a third semiconductor body disposed adjacent to the second semiconductor body and including a tandem vertical stack of at least a first upper, a second, third and a fourth bottom solar subcells, the first upper subcell having a top contact connected to the terminal of first polarity, the fourth bottom subcell having a bottom contact connected to the terminal of a second polarity;
wherein the top contact of the first upper subcells of the first, second and third semiconductor bodies are connected, and the fourth subcell of the first semiconductor body is connected in a series electrical circuit with the fourth subcell of the second semiconductor body, which in turn is connected in a series electrical circuit with the fourth subcell of the third semiconductor body.

16. A multijunction solar cell assembly as defined in claim 1, wherein the respective selection of the composition, band gaps, open circuit voltage, and short circuit current of each of the subcells maximizes the efficiency of the assembly (i)

at high temperature (in the range of 40 to 100 degrees Centigrade) in deployment in space at a predetermined time after the initial deployment (referred to as the beginning of life or BOL), such predetermined time being referred to as the end-of-life (EOL), wherein such predetermined time is in the range of one to twenty-five years; or (ii) at low temperature (in the range of −150 to −100 degrees Centigrade), and low solar radiation intensity less than 0.1 suns, in deployment in space at a predetermined time after the initial deployment (referred to as the beginning of life or BOL), such predetermined time being referred to as the end-of-life (EOL), wherein such predetermined time is in the range of one to twenty-five years.

17. A multijunction solar cell assembly as defined in claim 1, wherein one or more of the subcells have a base region having a gradation in doping that increases exponentially from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

* * * * *